(12) United States Patent
Brownlow et al.

(10) Patent No.: US 6,617,878 B2
(45) Date of Patent: Sep. 9, 2003

(54) VOLTAGE LEVEL SHIFTER AND DISPLAY DEVICE

(75) Inventors: Michael James Brownlow, Oxford (GB); Graham Andrew Cairns, Oxford (GB); Yasushi Kubota, Sakurai (JP); Hajime Washio, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/216,347

(22) Filed: Aug. 9, 2002

(65) Prior Publication Data

US 2003/0006801 A1 Jan. 9, 2003

Related U.S. Application Data

(62) Division of application No. 09/568,892, filed on May 11, 2000, now Pat. No. 6,476,637.

(30) Foreign Application Priority Data

May 12, 1999 (GB) ................................................ 9910879

(51) Int. Cl.[7] ........................ H03K 19/0175; G09G 3/36
(52) U.S. Cl. ............................. 326/68; 326/81; 326/83; 326/62; 327/333; 345/92; 345/94; 345/96; 345/204; 345/211
(58) Field of Search ............................ 326/62, 68, 80, 326/81, 83; 327/333; 345/89, 92, 94–96, 100, 204, 211

(56) References Cited

U.S. PATENT DOCUMENTS

| | | | |
|---|---|---|---|
| 4,583,203 A | 4/1986 | Monk | 365/189 |
| 4,618,785 A | 10/1986 | van Tran | 327/53 |
| 4,654,547 A | 3/1987 | Shaver | 326/113 |
| 5,087,834 A | 2/1992 | Tsay | 326/33 |
| 5,113,097 A | 5/1992 | Lee | 326/81 |
| 5,568,062 A | 10/1996 | Kaplinsky | 326/27 |
| 5,606,268 A | 2/1997 | Van Brunt | 326/68 |
| 6,081,131 A * | 6/2000 | Ishii | 326/68 |
| 6,262,598 B1 | 7/2001 | Cairns et al. | 326/81 |
| 6,292,183 B1 * | 9/2001 | Yamazaki et al. | 345/211 |
| 6,392,625 B1 * | 5/2002 | Sato et al. | 345/94 |

FOREIGN PATENT DOCUMENTS

| | | |
|---|---|---|
| CN | 335473 | 7/1998 |
| GB | 2133946 A | 8/1984 |

\* cited by examiner

*Primary Examiner*—Michael Tokar
*Assistant Examiner*—Vibol Tan
(74) *Attorney, Agent, or Firm*—Edwards & Angell, LLP; David G. Conlin; William J. Daly, Jr.

(57) ABSTRACT

A voltage level shifter comprises an input stage in the form of cross-coupled source followers and an output stage in the form of an amplifier AMP, which may have single-ended or differential inputs. The source followers comprise the transistors M1 and M2 and the transistors M3 and M4. Differential inputs IN and !IN are connected to the gates of the transistors M2 and M4. A bias voltage is supplied to the gate of the transistor M1 from a node B to which the drain of the transistor M3 and the source of the transistor M4 are connected. Similarly, a bias voltage is supplied to the gate of the transistor M3 from a node A to which the drain of the transistor M1 and the source of the transistor M2 are connected.

5 Claims, 9 Drawing Sheets

VOLTAGE LEVEL SHIFTER AND DISPLAY DEVICE

This application is a divisional of U.S. application Ser. No. 09/568,892, filed May 11, 2000 now U.S. Pat. No. 6,476,637, the teachings of which are incorporated herein by reference in its entirety.

BACKGROUND OF THE INVENTION

1. Field of the Invention

The present invention relates to a voltage level shifter and a display device incorporating such a voltage level shifter. Such a shifter may, for example, be used in large area silicon-on-insulator (SOI) circuits for interfacing with signals of smaller amplitudes. An example of such an application is monolithic driver circuitry for flat-panel matrix displays, such as liquid crystal displays, fabricated with low temperature poly-silicon thin-film transistors (TFTs) whore interfacing between signal levels of 3.3 to 5 volts and signals of 10 to 20 volts is often required.

2. Description of the Related Art

FIG. 1 of the accompanying drawings illustrates a known type of CMOS inverter, for example as disclosed in A. Bellaouar, M. Elmasry, "Low Power Digital VLSI Design", Kluwer Academic Publishers, 1995, which may be used to provide a limited range of level shifting. The inverter comprises a P-type transistor T1 and an N-type transistor T2 connected in series between a power supply line vdd and ground gnd. The drains of the transistors T1 and T2 are connected to an output !OUT for providing inverted output signals and the gates of the transistors are connected together to input IN.

A disadvantage of such an arrangement for implementation in TFT circuits is that the input voltage level must be greater than the switching point. However, this condition is difficult to achieve with low performance transistors having highly variable transistor characteristics. For example, typical signal levels produced in conventional large scale integrated circuits as used in active matrix liquid crystal display (AMLCD) interface circuitry range from 2.7 to 5.5 volts. The switching point of the inverter should range from 1.35 to 2.5 volts depending on the desired noise margin.

FIG. 2 of the accompanying drawings illustrates a typical switching characteristic of a CMOS inverter of the type shown in FIG. 1 as a function of the transistor characteristics and the supply voltage Vdd. The switching point $V_{th}$ of the inverter is defined as the input voltage at the intersection of Vin=Vout and is given by:

$$V_{th} = \frac{V_{Th} + \sqrt{\frac{\beta_p}{\beta_n}}(Vdd - |V_{Tp}|)}{1 + \sqrt{\frac{\beta_p}{\beta_n}}}$$

where $\beta_p$ and $\beta_n$ are the transconductances and $V_{tp}$ and $V_{tn}$ are the threshold voltages of the P-type transistor T1 and the N-type transistor T2, respectively.

The range of transistor parameters for which the inverter will switch with a given input voltage defines a "process margin". As illustrated by the above expression, in order to achieve low input voltage operation, it is necessary to ensure a low threshold voltage and a high mobility of the N-type transistor T2. Also, the switching point of the inverter increases with the supply voltage Vdd. In order to improve the performance of level shifters based on such inverters, it is known to connect several inverters in series and to apply different supply voltages to the inverters. However, level shifters of this type are not suitable for applications in which the transistor performance is not well defined and where a large signal level shift is required.

Another known type of level shifter is shown in FIG. 3 of the accompanying drawings and in based on differential techniques as used, for example, in sense amplifiers of memory circuits. Such a CMOS sense amplifier is also disclosed in Bellaouar at al (see above) and comprises P-type transistors T3 and T4 and N-type translators T5, T6 and T7. The transistors T5 and T6 form a differential pair with the transistor T7 acting as a tail current source with its gate connected to a terminal Vb for receiving a bias voltage. The transistors T3 and T4 are connected between the drains of the transistors T5 and T6, respectively, and the supply line vdd. The gate of the transistor T3 is connected to the drains of the transistors T4 and T6 and to an output terminal OUT whereas the gate of the transistor T4 is connected to the drains of the transistors T3 and T5 and to an output terminal !OUT for supplying inverted output signals. The gates of the transistors T5 and T6 are connected to complementary inputs IN and !IN for receiving complementary input signals.

Assuming that the transistors are perfectly matched and identical differential input voltages ate supplied to the inputs IN and !IN, the tail current set by the bias voltage flows in equal portions through the transistors T5 and T6 and hence through the transistors T3 and T4. This condition is meta-stable and changes in response to any perturbations of the differential input voltage. For example, if the voltage at the input IN is slightly larger than that at the input !IN, the transistor T5 turns on more than the transistor T6. This has the effect of lowering the voltage at the output !OUT. The transistor T4 is turned on more which increases the voltage at the output OUT. The transistor T3 is turned off further, which lowers the voltage at the output !OUT and increases the voltage at the output OUT. Thus, a slight imbalance in the input voltages is sensed and amplified at the output terminals !OUT and OUT.

A limitation of this type of circuit as a level shifter is that it requires that the logic high input levels supplied to the inputs be significantly higher than the threshold voltages of the N-type transistors. However, when embodied as a monolithic integrated circuit driver for an AMLCD, the threshold voltages of the N-type transistors can be as high as 4.5 volts.

For more efficient operation at lower input voltages, the conduction types of the transistors may be reversed to provide an arrangement as illustrated in FIG. 4 of the accompanying drawings, thus, the transistors T3 and T4 are N-type transistors whereas the transistors T5, T6 and T7 are P-type transistors. However, a disadvantage of this arrangement in that, when a high supply voltage Vdd and low input voltages are used, the transistors T5 and T6 operate in the linear regime. Differential amplifiers are much more efficient when the input transistors are operated in the saturated regime. In this condition, the difference in currents is greatest for a given differential input voltage so that the gain is higher for a given tail current.

FIG. 5 of the accompanying drawings illustrates another known type of level shifter in the form of a source follower, P-type transistors T8 and T9 are connected in series between the supply line vdd and ground gnd. The drain of the transistor T8 is connected to the source of the transistor T9 and to an output OUT. The gate of the transistor T8 is connected to receive the bias voltage Vb and the gate of the transistor T9 is connected to an input terminal IN, when the transistors T8 and T9 are in saturation, the output voltage is shifted positively by (VDD−Vb), assuming that the transistors T8 and T9 are matched. Two such level shifters may be used to drive a differential amplifier of the type shown in FIG. 3 or 4 in order to solve the problem of high N-type device threshold voltage or to maintain P-type devices in saturation. However, a disadvantage of such an arrangement arises from the many DC current paths.

SUMMARY OF THE INVENTION

According to a first aspect of the invention, there is provided a voltage level shifter comprising first and second voltage followers arranged to receive bias voltages from the second and first voltage followers, respectively.

According to a second aspect of the invention, there is provided a voltage level shifter comprising first to fourth transistors of a first conduction type, the first and second transistors being connected in series between first and second power supply inputs with the control electrode of the second transistor being connected to a first input for receiving a direct input signal, the third and fourth transistors being connected in series between the first and second power supply inputs with the control electrode of the fourth transistor being connected to a second input for receiving a complementary input signal, the control electrode of the first transistor being connected to the output electrode of the third transistor and the common electrode of the fourth transistor, and the control electrode of the third transistor being connected to the output electrode of the first transistor and the common electrode of the second transistor.

The source of at least one of the second and fourth transistors may be connected to an output circuit.

The output circuit may comprise an inverter. The inverter may comprise a fifth transistor of the first conduction type and a sixth transistor of a second conduction type different from the first type connected in series between the first and second power supply inputs, the control electrodes of the fifth and sixth transistors being connected to the source of one of the second and fourth transistors. Seventh and eighth transistors of the second conduction type may be connected in parallel with the second and fourth translators, respectively, with the control electrodes of the seventh and eighth transistors being connected to the second and first inputs, respectively.

The output circuit may comprise a differential amplifier whose differential inputs are connected to the sources of the second and fourth transistors. The differential amplifier may comprise ninth and tenth transistors of the first conduction type whose control electrodes are connected to the sources of the second and fourth transistors, respectively, and whose drains are connected to a current mirror.

The output of the differential amplifier may be connected to an inverter. The input of the inverter may be connected to a first pull-up or pull-down transistor whose control electrode is connected to a gating input.

One of the differential amplifier inputs may be connected to a second pull-up or pull-down transistor whose control electrode is connected to a gating input.

One of the first and second power supply inputs may be connected to the first to fourth transistors and the differential amplifier via an eleventh transistor whose control electrode is connected to a gating input.

The first and second inputs may be connected to control electrodes of the second and fourth transistors via twelfth and thirteenth transistors, respectively, whose control electrodes are connected to a gating input.

Each of the transistors may be field effect transistor whose common, control and output electrodes are source, gate and drain electrodes, respectively. Each of the transistors may be a thin film transistor.

The first conduction type may be P-type.

The shifter may comprise at least part of a CMOS integrated circuit.

The shifter may be connected to a display device.

The display device may be a flat-panel matrix display, especially an LCD device.

The LCD device may be an AMLCD.

According to a third aspect of the invention, there is provided a level shifting circuit comprising an input stage having first to fourth transistors of a first conduction type, the first and second transistors form a first source follower and are connected in series between first and second power supply inputs with the control electrode of the second transistor being connected to a first input for receiving a direct input signal, the third and fourth transistors form a second source follower and are connected in series between the first and second power supply inputs with the control electrode of the fourth transistor being connected to a second input for receiving a complementary input signal, the control electrode of the first transistor being connected to the output electrode of the third transistor and the common electrode of the fourth transistor, and the control electrode of the third transistor being connected to the output electrode of the first transistor and the common electrode of the second transistor; and an output stage, wherein the source of at least one of the second and fourth transistors is connected to the output stage.

The output stage may be an amplifier.

The amplifier may be a CMOS inverter.

The first to fourth transistors may be P-type transistors.

According to the fourth aspect of the invention, there is provided a display device having:
a matrix having elements corresponding to pixels of the display;
at least one driver connected to the matrix to drive the matrix;
an input device for receiving external input signals via input terminals, the input device being connected to the at least one driver for outputting level shifted signals;
wherein the input device comprises a voltage level shifter of the present invention, and the first to fourth transistors are P-type transistors.

The input terminals may be directly connected to the control electrodes of the second and fourth transistor.

The matrix may be the matrix of an AMLCD.

The at least one driver may be a gate driver and/or a source driver.

The driver may be implemented in poly-Silicon having thin film transistors as switching elements.

It is thus possible to provide a level shifter which is capable of providing large shifts in signal levels and which has a wide process margin. Only one conduction type of transistor is required at the input so that there is no need to consider matching between N-type and P-type transistors. Such an arrangement also provides controlled current consumption with the cross-coupling ensuring that the majority of the quiescent flows in only one of the voltage followers.

BRIEF DESCRIPTION OF THE DRAWINGS

The invention will be further described by way of example, with reference to the accompanying drawings, in which.

Like reference numerals refer to like parts throughout the drawings.

DESCRIPTION OF THE PREFERRED EMBODIMENTS

Figure 1:
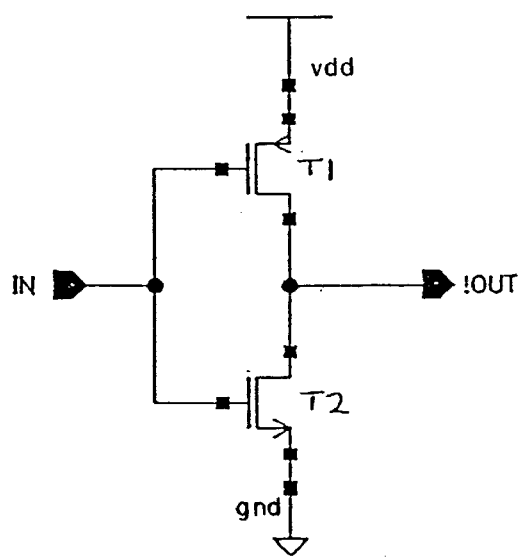
FIG. 1 is a circuit diagram of a known type of inverter which may operate as a voltage level shifter.
Figure 2:
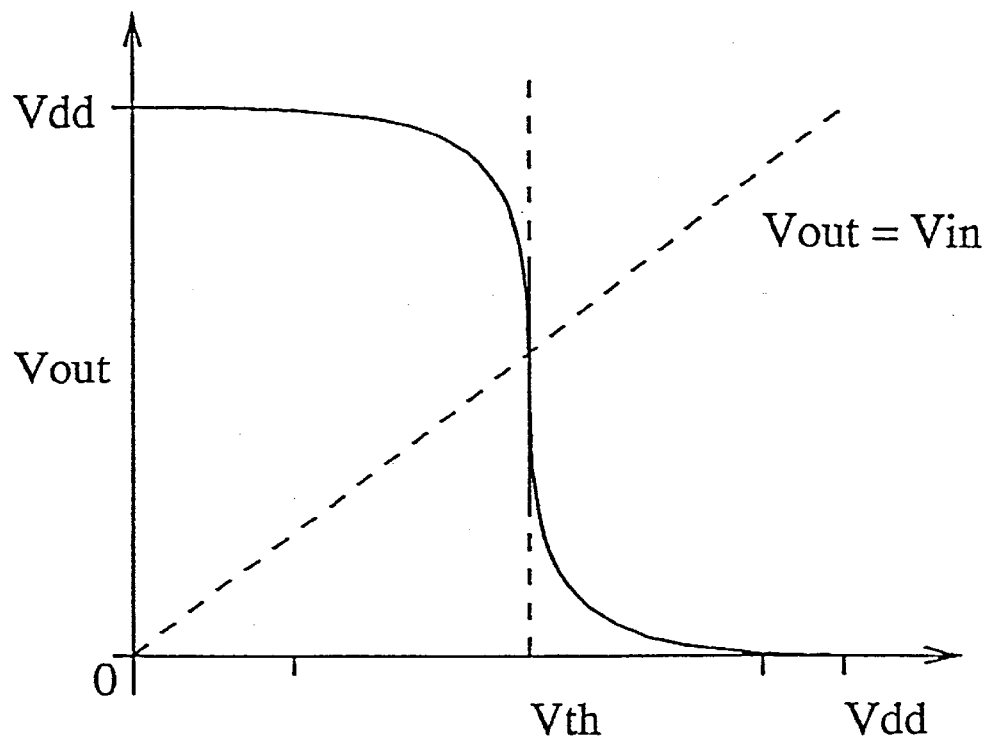
FIG. 2 is a graph illustrating the switching characteristics of the inverter of FIG. 1.
Figure 3:
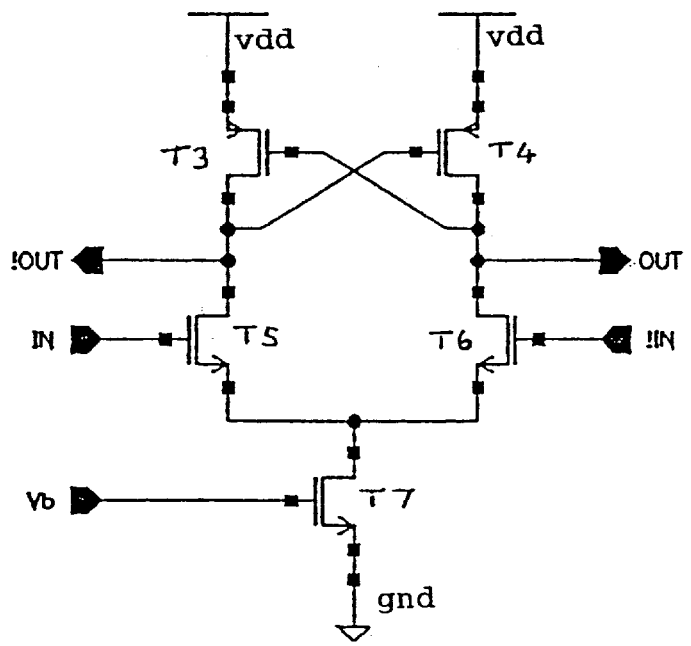
FIG. 3 is a circuit diagram of a known type of sense amplifier which may be used as a voltage level shifter.
Figure 4:
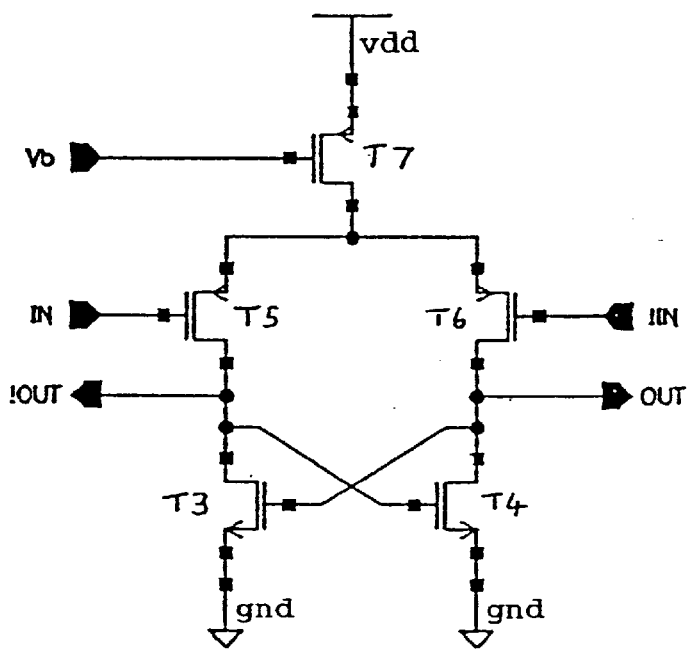
FIG. 4 is a circuit diagram of a sense amplifier of the type shown in FIG. 3 but with inverted polarity and complementary devices.
Figure 5:
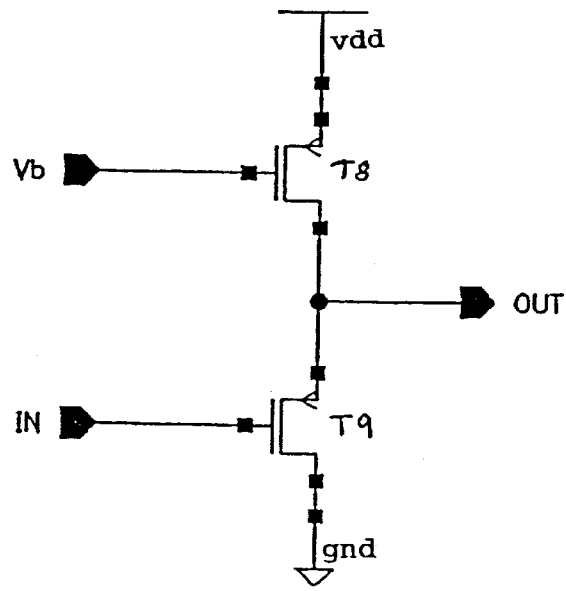
FIG. 5 is a circuit diagram of a known type of source follower which may be used as a voltage level shifter.
Figure 6:
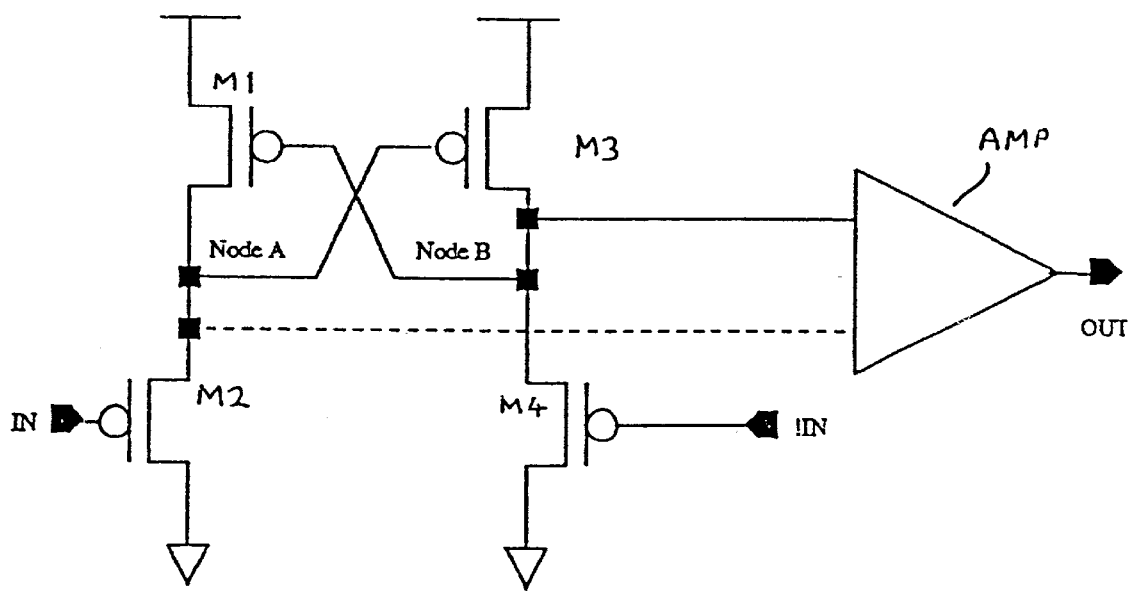
FIG. 6 is a schematic circuit diagram of a level shifter constituting a first embodiment of the invention.

The level shifter shown in FIG. 6 comprises an input stage in the form of cross-coupled source followers driven by complementary input logic signals. The bias voltage for each source follower in supplied by the other source follower. The level shifter further comprises an output stage in the form of an amplifier AMP which may be of the single ended input or differential input type. The amplifier AMP ensures that a full logic swing is provided at the output of the level shifter.

The input stage comprises P-type transistors M1 to M4. The transistors M1 and M2 form a first source follower with an input IN and an output node A. The transistors M3 and M4 form a second follower with a complementary input !IN and an output node B.

The bias voltage for the first source follower is supplied from the node B to the gate of the transistor M1 whereas the bias voltage for the second source follower supplied from the node A to the gate of the transistor M3. Thus, the bias voltages are derived from the level-shifted versions of the complementary input signals.

When the input signal supplied to the input IN is at a high logic level and the complementary input signal at the input !IN is at a low logic level, the current through the transistor M2 is reduced compared with the current through the transistor M4. The voltage at the node A rises by virtue of the level shifting action of the source follower M1 and M2 and this reduces the blue voltage supplied between the gate and the source of the transistor M3. Because the transistor M4 is turned on more than the transistor M3, the voltage at the node B tends towards a level shifted version of the input low level voltage. The cross-coupling results in a voltage swing at the nodes A and B which is greater than the input voltage swing. In practice, the transistors M1 and M3 have a much lower drive capability than the transistors M2 and M4 to ensure proper switching of the nodes A And B and to reduce the quiescent current consumption.

Figure 7:
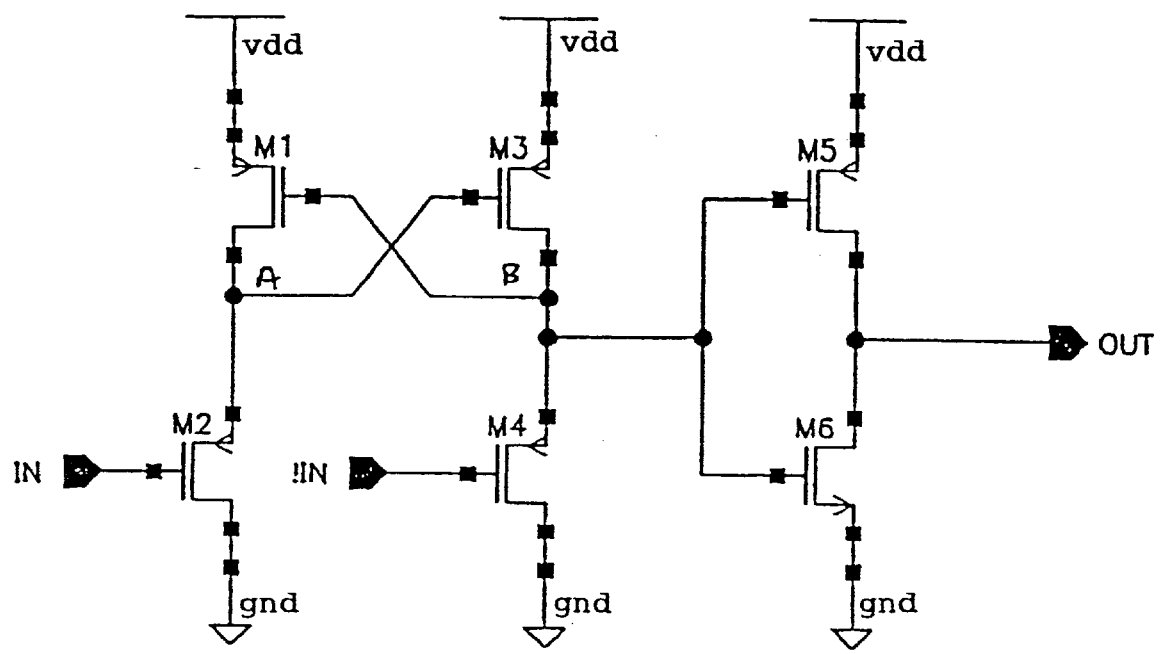
FIG. 7 is a circuit diagram of a level shifter constituting a second embodiment of the invention.

The level shifter shown in FIG. 7 comprises the input stage shown in FIG. 6 with the amplifier AMP being embodied as a CMOS inverter. In particular, the inverter comprises a P-type transistor M5 and an N-type transistor M6 connected in series between the supply line vdd and ground gnd. The drains of the transistors M5 and M6 are connected to the output terminal OUT whereas the gates of the transistors M5 and M6 are connected to the drain of the transistor M3 and the source of the transistor M4.

Figure 8:
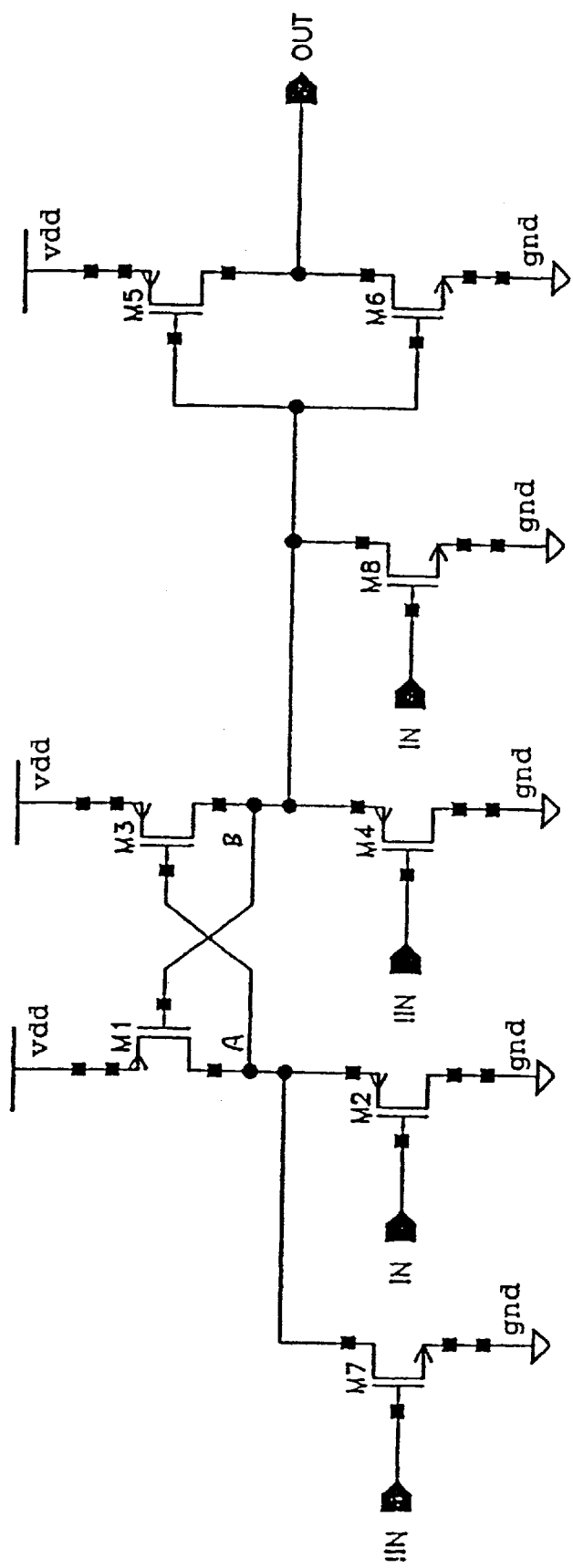
FIG. 8 is a circuit diagram of a level shifter constituting a third embodiment of the invention.

In order to improve the robustness of the level shifter, N-type transistors M7 and M8 may be connected in parallel with the transistors M2 and M4 as shown in FIG. 8. The gates of the transistors M2 and M8 are connected to the first direct input IN whereas the gates of the transistors M4 and M7 are connected to the second complementary input !IN. The transistors M7 and M8 ensure that, if the switching point of the inverter is very low (for example due to high performance N-type devices and poor performance P-type devices), the input to the inverter reaches a sufficiently low level to switch the inverter output to its high state. If the N-type device performance is not so high, then the switching point of the inverter is higher so that the level shifted signals at the nodes A and B have sufficient voltage owing to ensure that the inverter switches correctly.

Figure 9:
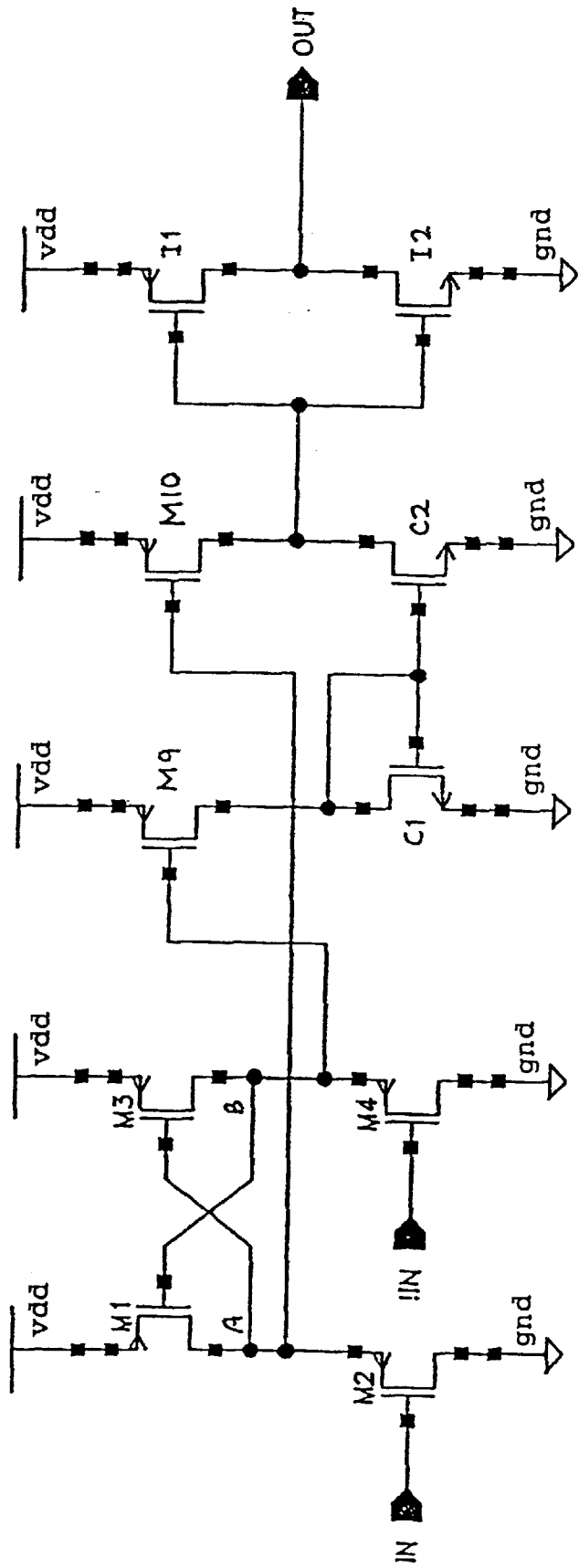
FIG. 9 is a circuit diagram of a level shifter constituting a fourth embodiment of the invention.

FIG. 9 illustrates a level shifter in which the output stage comprises a differential amplifier whose differential inputs are connected to the nodes A and B. The differential amplifier comprises P-type transistors M9 and M10 whose drains are connected to a current mirror formed by N-type transistors C1 and C2.

The transistor M9 tracks the current through the transistor M1 whereas the transistor M10 tracks the current through the transistor M3. The current through the transistor M9 is mirrored by the current mirror so that the current flowing through the transistors M10 and C2 tracks the differential input voltage and generates a single ended output voltage which is sufficiently large to drive a CMOS inverter formed by complementary transistors I1 and I2 with a very wide tolerance to variations in the transistor parameters.

Figure 10:
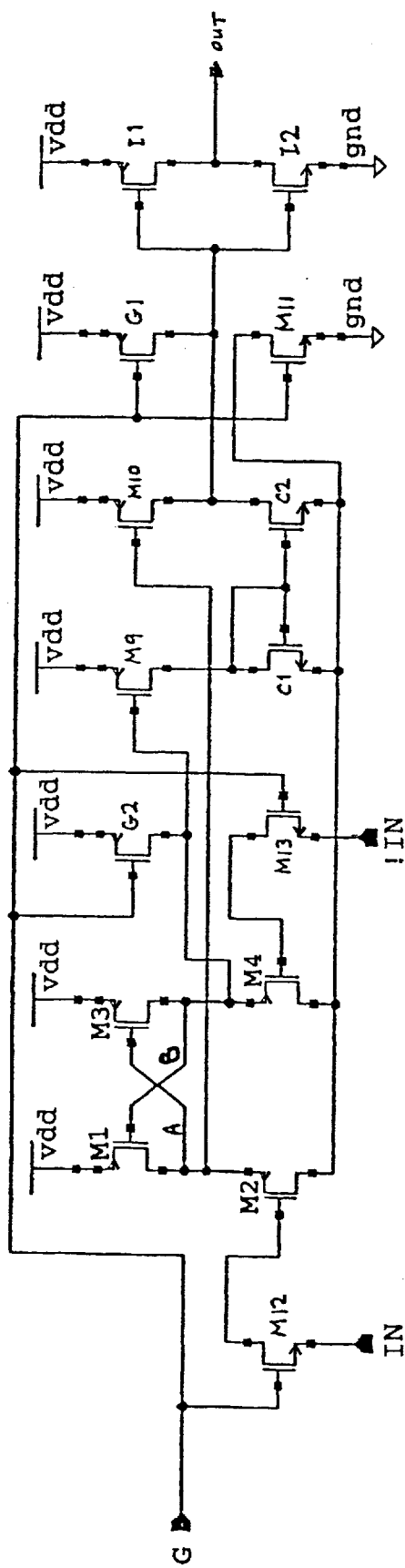
FIG. 10 is a circuit diagram of a level shifter constituting a fifth embodiment of the invention.

In some applications, a level shifting function is required only intermittently so that it in possible to control the power consumption of the level shifter by turning it off during periods of inactivity. It is also often desirable to gate the input signals so as to reduce the load seen by the input signals. FIG. 10 shows a level shifter of the type shown in FIG. 9 provided with gating arrangements to achieve this.

Gating is controlled by a gating signal supplied to a gating input G. When the gating signal is high, the level shifter is active and produces a level-shifted version of the complementary input signals at the output. When the gating signal in low, the level shifter is inactive and the output defaults to a logic low level.

The inputs IN and !IN are connected via N-type transistors M12 and M13 to the gates of the transistors M2 and M4, respectively. The gates of the transistors M12 and M13 are connected to the gating input G and isolate the gate capacitances of the transistors M2 and M4 from signal lines connected to the inputs when the level shifter is inactive.

An N-type transistor M11 is connected between ground gnd and the supply line to the drains of the transistors M2 and M4 and the sources of the transistors C1 and C2. The gate of the transistor M11 is connected to the gating input G. Thus, when the gating signal is high, the transistor M11 is turned on and connects the cross-coupled source follower and the differential amplifier to ground so as to supply power thereto. When the gating signal is low, the transistor M11 is switched off and thus disconnects the source followers and the differential amplifier from the power supply.

The gates of the inverter transistors I1 and I2 are connected to the supply line vdd via a P-type transistor a G1 whose gate is connected to the gating input G. When the gating signal is high, the transistor G1 is turned off and has no affect on the operation of the level shifter. When the gating signal is low, the transistor G1 is turned on and connects the input of the inverter to the supply line vdd which is equivalent to a logic high level. The output of the inverter thus defaults to a logic low level when the level shifter is inactive.

A P-type transistor G2 is connected between the node B and the supply line vdd with its gate connected to the gating input G. When the gating signal is high, the transistor G2 is switched off and has no effect on the operation of the level shifter. When the gating signal is low, the transistor G2 is turned on and maintains the node B at the voltage of the supply line vdd so as to ensure that, during start-up, conditions are favourable during the transient conditions which occur on activation of the gating signal.

Figure 11:
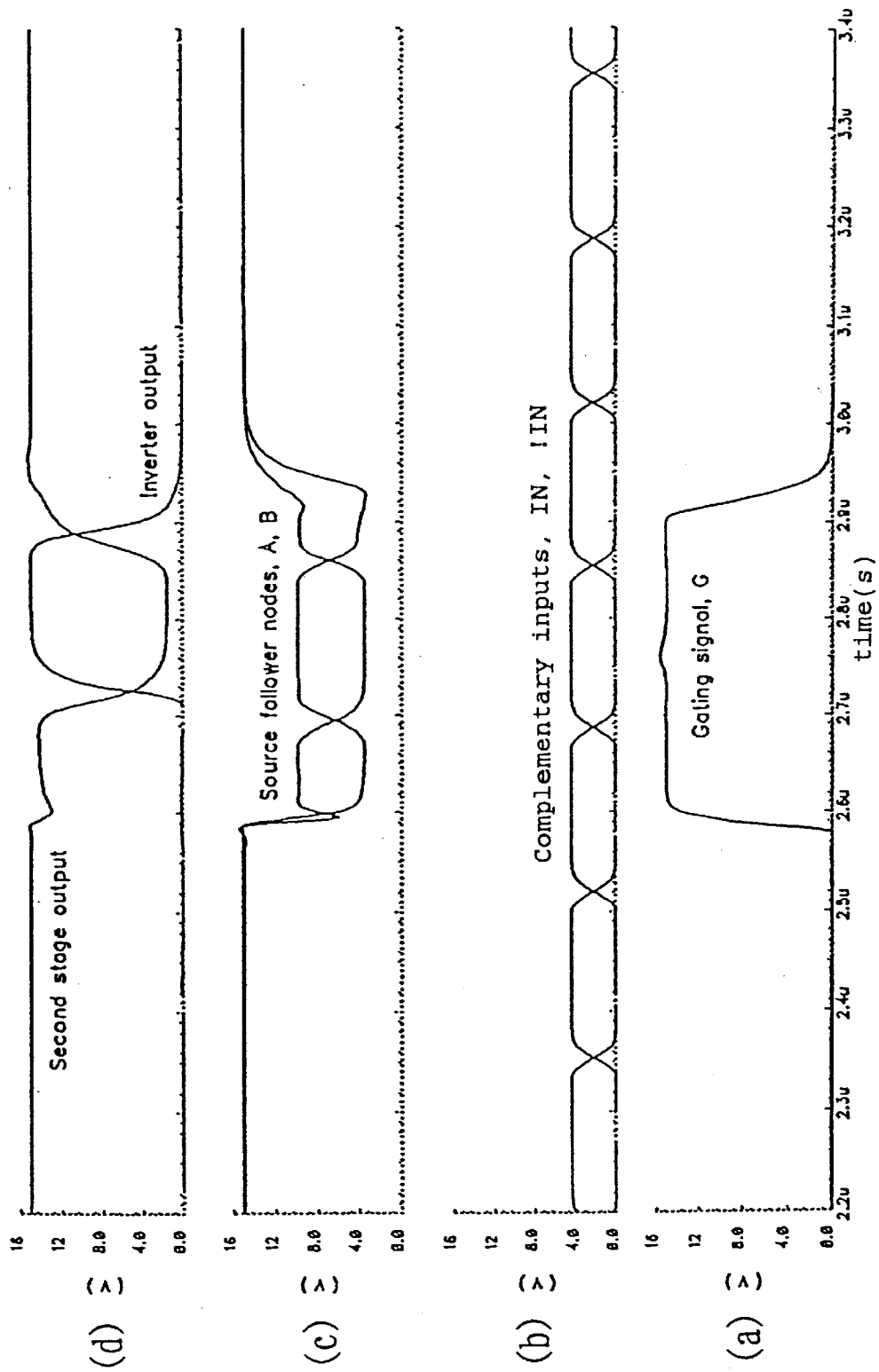
FIGS. 11(a) to 11(d) are each a waveform diagram illustrating waveforms occurring in a simulation of the level shifter shown in FIG. 10.

FIGS. 11(a) to 11(d) illustrate the result of a simulation of the level shifter shown in FIG. 10. For the purposes of the simulation, the supply voltage Vdd was 15 volts and the amplitude of the input signals at the inputs IN and !IN was 4.5 volts. The waveform shown in FIG. 11(a) represents the gating signal supplied to the gating input G. The waveforms shown in FIG. 11(b) represent the complementary input signals supplied to the inputs IN and !IN. The waveforms shown in FIG. 11(c) represent the source follower outputs appearing at the nodes A and B. The waveforms shown in FIG. 11(d) represent the output of the second or differential amplifier stage appearing at the drains of the transistors M10 and C2 and the output of the inverter I1, I2 forming the output of the level shifter.

With the gating signal initially at its low level, the transistor M11 is turned off so that no current flows through the source followers and the differential amplifier. The transistors G1 and G2 are turned on so that the source follower nodes A and B and the second stage output are at the voltage Vdd of the supply line vdd. The output of the inverter is at its default low level.

When the gating signal switches to its high level, the transistors M11, M12 and M13 are turned on and a level shifted version of the complementary input signal is generated between the nodes A and B. The voltage levels at these nodes are approximately 3 volts for a logic low signal and 10 volts for a logic high signal giving a logic swing of approximately 7 volts for an input signal amplitude of 4.5 volts. The differential amplifier generates output levels of approximately 14 volts for a logic high level and 1 volt for a logic low level. This is sufficient to drive the inverter I1, I2 to produce a full logic output swing between 0 and 15 volts.

When the gating signal returns to its low level, the level shifter returns to its default condition with no quiescent current and the output at the logic low level.

It is thus possible to provide a signal level shifter which is capable of providing large voltage shifts in a relatively low voltage input signal referenced to ground. The level shifter is highly tolerant of variations in transistor characteristics and thus provides a large process margin. Such a level shifter may therefore be embodied using low performance thin-film transistors and may be used to provide an interface between conventional signal voltage levels, for example provided by large scale integrated circuits, and circuits operating at high levels such as monolithic drivers for active matrix displays.

Figure 12:
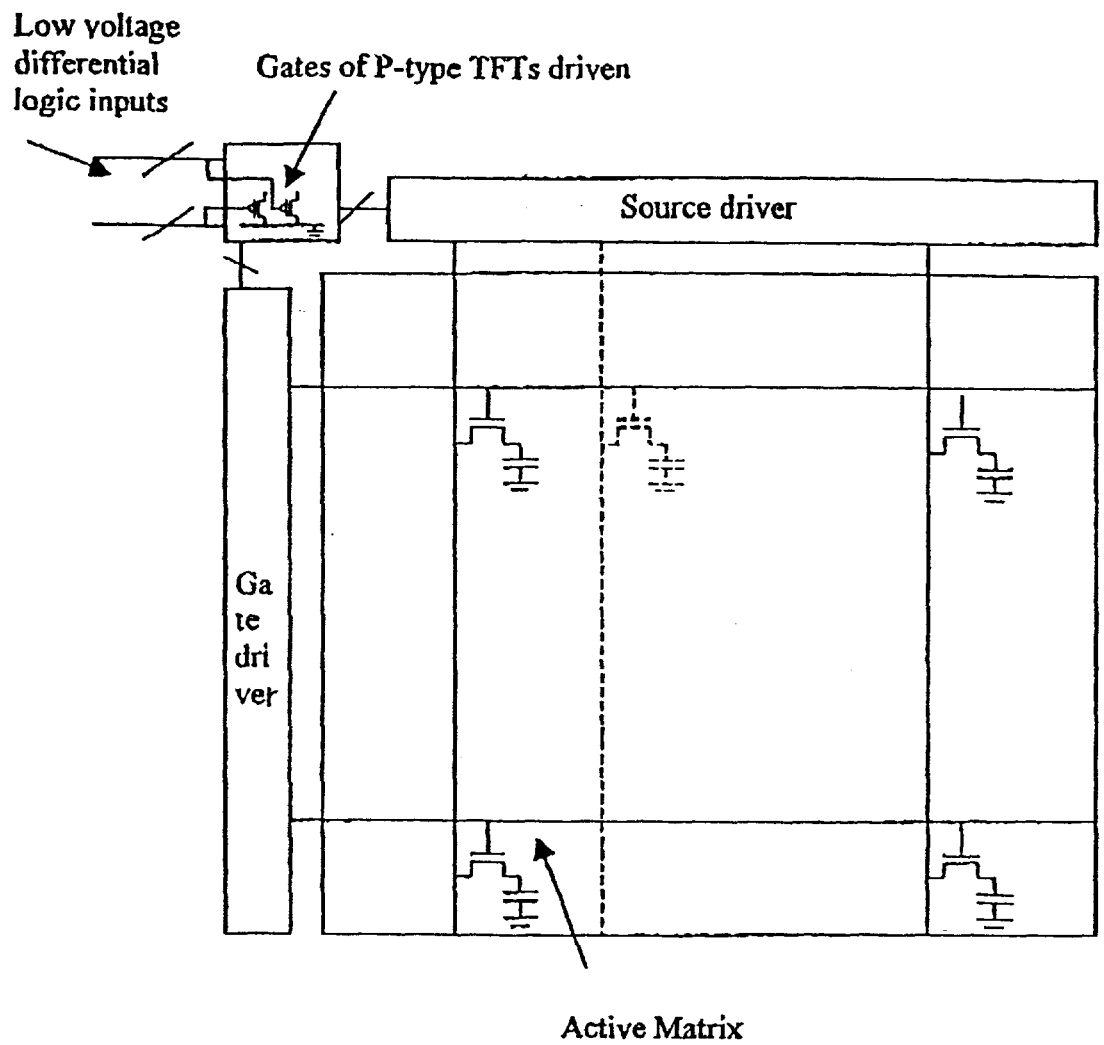
FIG. 12 is a diagram showing an example of an AMLCD having a voltage level shifter interfacing the LCD driver electronics.

FIG. 12 shows a diagram according to an example of an AMLCD having a voltage level shifter interfacing the LCD driver electronics. The AMLCD has monolithic poly-Silicon TFT drivers and a low voltage interface with a plurality of level shifters in accordance with the present invention, as described above.

To reduce the power consumption of the AMLCD control electronics, control signals having a low voltage are employed, wherein for example signals of the order of 2–3V can be applied to the input of the display device. However, it is a general characteristic of poly-Silicon TFTs, such as e.g. employed in the drivers, to exhibit much higher threshold voltages than conventional single crystal silicon MOS transistors. This high threshold voltage causes difficulties when driving the poly-Silicon circuitry with low voltage inputs. Therefore some form of level shifting and amplification, which is robust to high threshold voltages, has to be performed by the interfacing circuit.

The LCD driver electronics of the shown example have gate and source driver circuits interfaced by a voltage level shifter circuit having a plurality of voltage level shifters for controlling the monolithic LCD drivers. The interfacing circuit according to the present invention is capable to operate with low voltage control signals, wherein P-Type TFT input transistors are provided. The respective gate electrodes are directly connected to the external LSI low voltage inputs. In this manner, it is ensured that the P-Type TFTs, which have negative threshold voltages, are always turned on by the low voltage inputs.

As shown in FIG. 12 the gates of the transistors of the interfacing circuit are connected to low voltage differential logic inputs. It is noted, that the shown interfacing circuit can be any voltage level shifter as described above, including the embodiments described having gating arrangements. In this case an additional gating input G can be provided, as shown in the above examples. Thus, the shown TFT transistors of FIG. 12 serve only explanatory purposes, but it is not intended that the invention is limited to the shown embodiment.

What is claimed is:

1. A display device having:
   a matrix having elements corresponding to pixels of the display;
   at least one driver connected to the matrix to drive the matrix;
   an input device for receiving external input signals via input terminals, the input device being connected to the at least one driver for outputting level shifted signals; and
   wherein the input device comprises a voltage level shifter, said voltage level shifter including:
   first to fourth transistors, where the first to fourth transistors are P-type transistors,
   the first and second transistors being connected in series between first and second power supply inputs with the control electrode of the second transistor being connected to a first input for receiving a direct input signal,
   the third and fourth transistors being connected in series between the first and second power supply inputs with the control electrode of the fourth transistor being connected to a second input for receiving a complementary input signal, the control electrode of the first transistor being connected to the output electrode of the third transistor and the common electrode of the fourth transistor, and the control electrode of the third transistor being connected to the output electrode of the first transistor and the common electrode of the second transistor.

2. The display device according to claim 1, wherein the input terminals are directly connected to the control electrodes of the second and fourth transistor.

3. The display device according to claim 1, wherein the matrix is the matrix of an AMLCD.

4. The display device according to claim 1, wherein the at least one driver is a gate driver and/or a source driver.

5. The display device according to claim 1, wherein the driver is implemented in poly-Silicon having thin film transistors as switching elements.

* * * * *